United States Patent
McSwiggen et al.

[19]

[11] Patent Number: 5,975,716
[45] Date of Patent: Nov. 2, 1999

[54] MOUNTING BAR FOR SPACING INDICATOR LIGHTS USED IN ELECTRONIC EQUIPMENT

[75] Inventors: John P. McSwiggen, Inver Grove Heights; John A. Trine, Minneapolis, both of Minn.

[73] Assignee: Wilbrecht Electronics, Inc., St. Paul, Minn.

[21] Appl. No.: 09/076,242

[22] Filed: May 12, 1998

[51] Int. Cl.⁶ ........................................ F21V 21/00
[52] U.S. Cl. .................. 362/249; 362/250; 362/285; 362/368; 362/389; 362/418; 362/800
[58] Field of Search .................. 362/249, 250, 362/285, 368, 389, 418, 800

[56] References Cited

U.S. PATENT DOCUMENTS

| | | |
|---|---|---|
| 3,540,687 | 11/1970 | Cuva . |
| 4,398,240 | 8/1983 | Savage, Jr. ............................. 362/311 |
| 4,471,415 | 9/1984 | Larson et al. ........................... 362/250 |
| 4,555,749 | 11/1985 | Rifkin et al. . |
| 4,575,785 | 3/1986 | Lerude et al. . |
| 4,667,277 | 5/1987 | Hanchar .................................. 362/250 |
| 4,803,599 | 2/1989 | Trine et al. . |
| 4,999,755 | 3/1991 | Lin ......................................... 362/250 |
| 5,121,311 | 6/1992 | Cheselske .............................. 362/249 |

*Primary Examiner*—Sandra O'Shea
*Assistant Examiner*—John A. Ward
*Attorney, Agent, or Firm*—Moore & Hansen

[57] ABSTRACT

A mounting bar for spacing apart indicator lights used in electronic equipment has a channel bar with a base and a top edge from which spaced apart mounting fingers cantileverly extend. The channel bar, base, and fingers form a cavity within which indicator light modules are frictionally held. The indicator light modules may have extending protrusions which engage the gaps between the mounting fingers. The protrusions may be of the same width between the mounting fingers, or may be wider than the gaps between the mounting fingers for increased frictional retention of the indicator lights within the mounting bar.

12 Claims, 3 Drawing Sheets

# MOUNTING BAR FOR SPACING INDICATOR LIGHTS USED IN ELECTRONIC EQUIPMENT

BACKGROUND OF THE INVENTION

The present invention relates to a device for mounting a visual indicator lamp or light emitting diode (LED) module, and specifically to positioning and securing the indicator lamp or LED module against unwanted movement.

Many mounting configurations for LEDs have been used to hold the LEDs in position. These include individual sockets mounted to a mounting system, as well as individual LED modules mounted along a solid bar. Examples of such mounting configurations are disclosed more fully in U.S. Pat. No. 4,471,415, which is owned by the Assignee to the present invention, and which is hereby incorporated by reference in its entirety herein.

While a mounting bar such as that disclosed in U.S. Pat. No. 4,471,415 allows for retention of LED modules spaced along a mounting bar, when the LED modules or indicator lights are closely spaced, the top wall of the solid mounting bar may not provide adequate spring pressure to hold the modules in the mounting bar. This problem with retention of the LED modules or indicator lights is due to the bar deflection of the solid mounting bar. Since the bar is a solid piece, a small deflection near the module may prevent the bar from touching another module closely spaced from the first module. When a solid bar holding closely spaced modules does not allow adequate holding pressure, the LED modules or indicator lights may shift or even fall out of the mounting structure.

LED modules and indicator lights may vary somewhat in size. When modules of varying size are closely spaced, and the inter-module spacing is decreased, the mounting bar may not even touch a specific module due to bar deflection characteristics of the solid bar. When this happens, the module may shift, become loose, or even fall out of the mounting, or pull free from a connected circuit board, potentially creating a number of problems.

Further, the use of a single solid bar of uniform construction as is disclosed in the '415 patent does not allow for precision in location of modules with respect to one another. Without performing exacting measurements and the like, consistency in spacing is not readily obtainable.

Other structures for non-measured spaced mounting of LED modules and indicator lights are disclosed, for example, in U.S. Pat. Nos. 4,803,599 and 4,555,749. These mounting schemes do not provide for individual support and retention of LED modules or indicator lights in the mounting structure.

Since the LED modules and indicator lights are often held in the mounting bar or mounting structure in such a fashion that requires their exact placement and spacing, the failure of a mounting bar or scheme to quickly and accurately retain the LED modules or indicator lights in a specific orientation and location can create significant problems. Leads extending from the LED modules or indicator lights are often physically attached to a printed circuit board or the like, and any movement of the LED modules or indicator lights may not only cause damage to the indicator lights or LED modules, but also to the printed circuit board to which they are attached.

Many mounting schemes for LED modules and indicator lights, including those having individual sockets or placements for the LED modules or indicator lights, do not permit the modules or lights to be individually replaced without removing more than one LED module or indicator light. The invention disclosed in the '415 patent did allow for individual replacement of LED modules and indicator lights. However, due to the solid uniform construction of the mounting bar of that invention, when an individual LED module or indicator light was to be replaced, the deflection characteristics of the solid mounting bar, as discussed above, might cause displacement or loosening of adjacent LED modules due to bar deflection.

It would be desirable, therefore, to provide a mounting bar which will allow for individual placement and replacement of LED modules or indicator lights without loosening or moving adjacent indicator lights or LED modules.

It would further be desirable to provide a mounting bar which allows for a higher quality contact between the mounting bar and individual LED modules or indicator lights, without the problems associated with a solid mounting bar.

It would also be desirable to provide a mounting bar which allows for precise intermediate spacing between multiple LED modules and indicator lights.

SUMMARY OF THE INVENTION

The present invention overcomes the problems of the prior art by providing a mounting bar assembly for spacing indicator lights or LED modules, having an elongated bar of uniform cross-section, a base flange, and with a plurality of spaced apart individually cantileverly mounted fingers. The elongated bar, base flange and individual mounting fingers define a cavity in which LED modules or indicator lights may be held. The individually mounted fingers act as independent springs, and each have a contact point for holding an LED module or indicator light within the mounting structure.

The individual mounting fingers of the present invention allow for at least one contact point on each LED module or indicator light placed in the mounting structure, provided that the individual mounting fingers are sufficiently narrow in width compared to the LED modules or indicator lights. When each LED module or indicator light has a contact point, the problems associated with bar deflection of an elongated solid bar are reduced. While the individual mounting finger widths are preferably smaller than the width of an LED module or indicator light, the invention would still provide increased holding capability for LED modules and indicator lights even if each individual mounting finger were substantially the same width or even slightly wider than a typical LED module or indicator light. Each mounting finger exerts a spring force on its associated LED module or indicator light, serving to more effectively hold the LED module or indicator light within the mounting bar assembly. Slots between the individual mounting bars allow each bar to act as an individual cantilevered beam. The individual mounting fingers may be formed integrally with the elongated solid bar and base flange, or may be affixed or attached to the elongated bar using traditional fastening methods.

In order to facilitate exact spacing and location placement of individual LED modules or indicator lights, especially with respect to one another, the individual modules or indicator lights may be equipped with a locating protrusion such as a bump or wedge, which would fit into either the gaps between the individual mounting fingers or into an associated opening within the individual cantilevered mounting fingers.

When an individual LED module or indicator light is to be placed at a specific location within the cavity of the mounting structure, the protrusion on the LED module or indicator light need only be aligned with an appropriately positioned opening within a mounting finger. This precision in location allows the user to quickly, specifically, and fixedly locate the indicator light or LED module at a specific location along the mounting structure, or at a specified distance from another LED module or indicator light. Such a configuration of protrusions and openings allows for defined and fixed inter-module spacing, which in turn allows for greater precision in constructing printed circuit boards and the like. Additionally, if the indicator lights or LED modules are required to be specifically spaced due to their intended use or operation, such a mounting scheme will facilitate both rapid and accurate placement and spacing of LED modules and indicator lights without the need for measurement, or the concern regarding module displacement, loosening, and slippage.

These and other benefits of the present invention will become apparent from the following detailed description thereof taken in conjunction with the accompanying drawings, wherein like reference numerals designate like elements throughout the several views.

DESCRIPTION OF THE PREFERRED EMBODIMENTS

Figure 1:
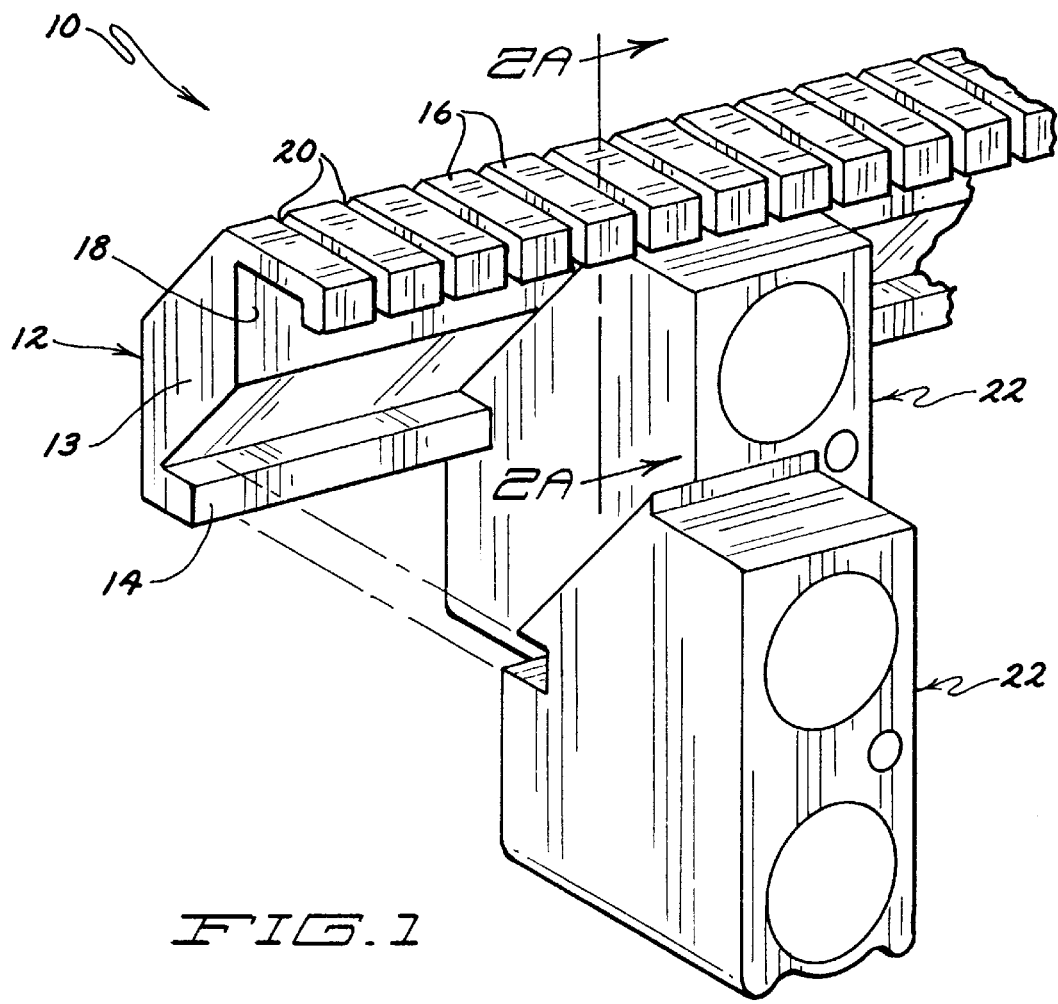
FIG. 1 is a perspective view of a mounting bar and an LED mounted module thereon.
Figure 2A:
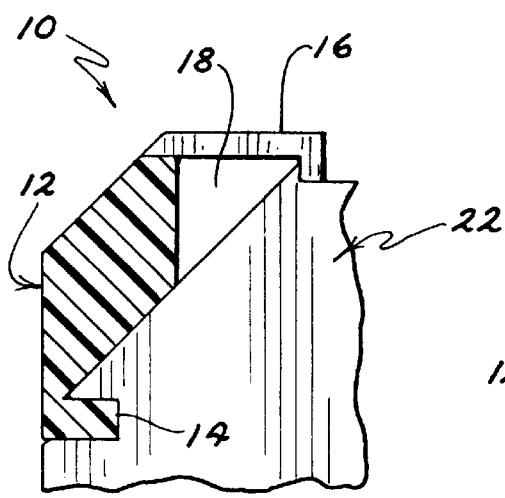
FIG. 2A is a section view of the mounting bar of FIG. 1 taken along lines 2A—2A thereof.
Figure 2B:
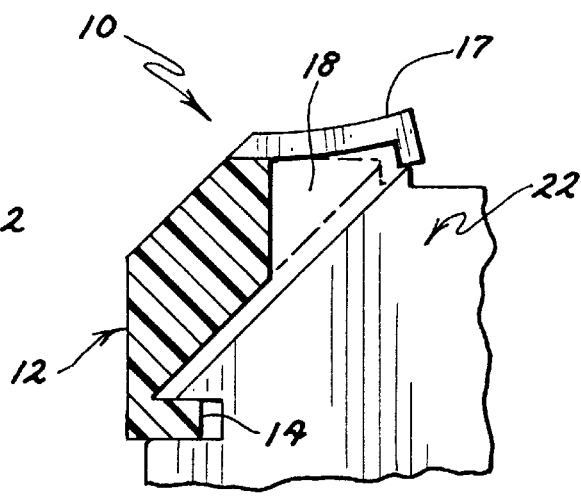
FIG. 2B is a side elevation view showing finger deflection on installation or removal of an LED module.

Referring now to the drawings, and especially to FIGS. 1–2, the mounting bar assembly 10 may be seen. Mounting bar assembly 10 may be seen to have an elongated channel bar 12 of uniform cross-section, a horizontal base flange 14, and a plurality of spaced apart mounting fingers 16. The individual mounting fingers 16 are either formed integrally with the elongated bar 12, or are mounted thereto. The elongated bar 12, base flange 14, and mounting fingers 16 define a cavity 18 therebetween.

The mounting fingers 16 are spaced apart by a plurality of gaps 20. The gaps 20 allow each individual mounting finger 16 to act as a separate cantilevered unit. Each mounting finger 16 can be separately deflected and provides a return spring force, to thereby hold an LED module or indicator light either individually, or in combination with one or more other mounting fingers 16.

Figure 6:
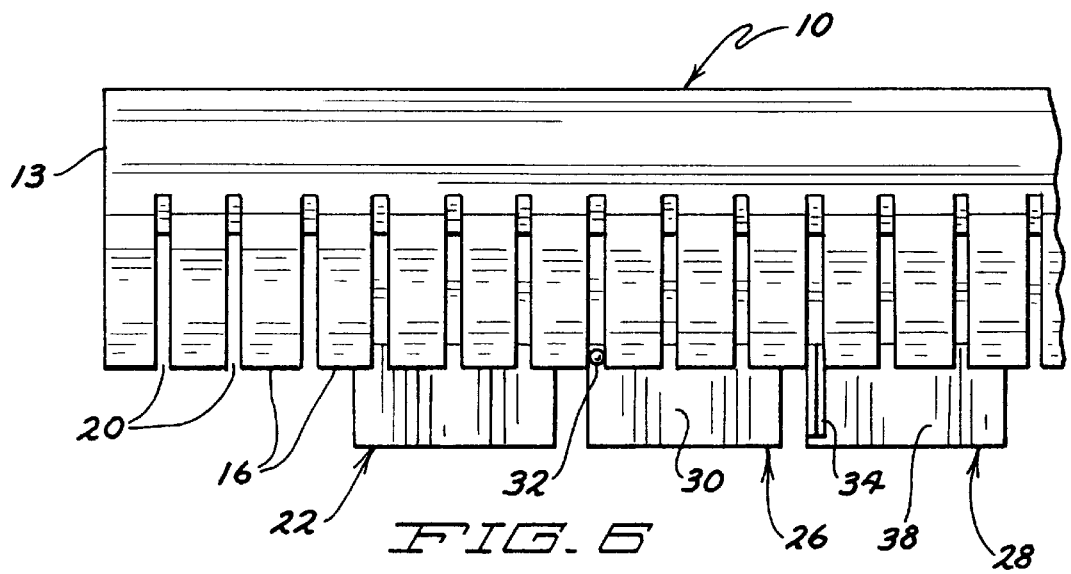
FIG. 6 is a top view of the mounting bar and alternative LED modules mounted thereon.
Figure 5:
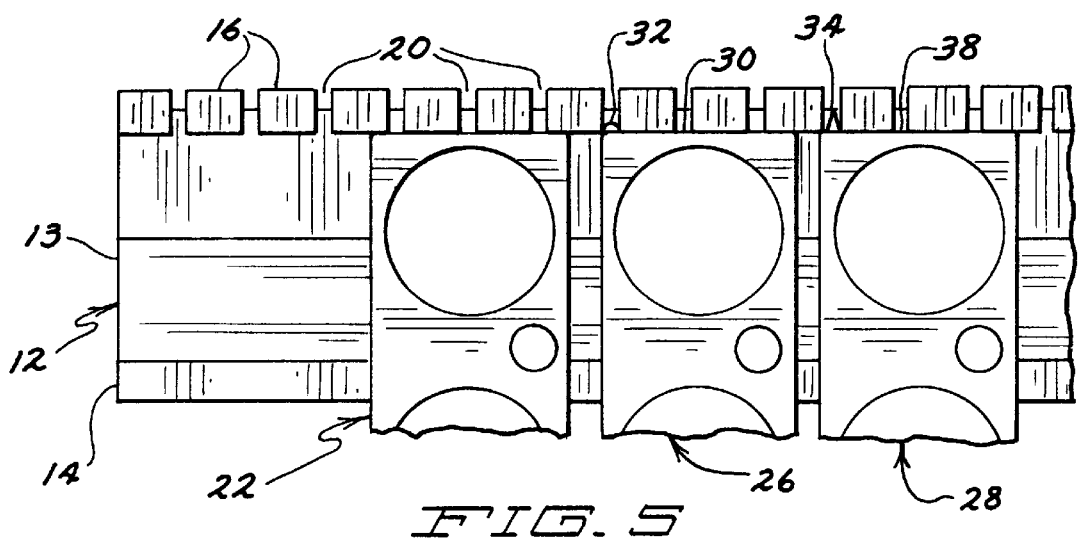
FIG. 5 is a front elevation view of the mounting bar and alternative LED modules mounted thereon.

LED modules or indicator lights 22 are seen in place on mounting bar assembly 10 in FIGS. 1 and 5–6. The LED modules or indicator lights 22 conform in shape to the elongated bar 12, base flange 14, and mounting fingers 16 comprising mounting bar assembly 10. The individual mounting fingers 16 each serve as an independent cantilevered beam. These beams 16, in conjunction with base flange 14 and the contour of the elongated bar 12, retain LED modules or indicator lights 22 within cavity 18 of the mounting bar assembly 10.

The individual mounting fingers 16 of the mounting bar assembly 10 allow for at least one point of contact between at least one individual mounting finger 16 and the LED module or indicator light 22 which is placed in the cavity 18 and held by mounting bar assembly 10. The individual mounting fingers 16 are preferably sufficiently narrow in width compared to LED modules or indicator lights 22 to ensure that each individual mounting finger 16 contacts only one or a small number of LED modules or indicator lights 22. This is best shown in FIGS. 1 and 5–6. While the widths of individual mounting fingers 16 are preferably smaller than the width of an LED module or indicator light 22, the mounting bar assembly 10 would still provide an increased ability to retain indicator lights or LED modules 22 within cavity 18 of the mounting bar assembly 10 even if the individual mounting fingers 16 were wider than the preferred width. Of course, the wider the individual mounting fingers 16, the greater the chance of a mounting finger deflection sufficient to allow the LED module or indicator light 22 to loosen, move, or fall out of the mounting bar assembly 10.

The slots 20 between the individual mounting fingers 16 allow the individual mounting fingers 16 to move independently from one another. Because of this freedom to move independently from one another, the mounting fingers 16 allow for easy selective removal and replacement of LED modules or indicator lights 22, without disturbing adjacent LED modules or indicator lights 22. In the embodiment as shown in FIG. 1, multiple individual mounting fingers 16 come in contact with and help to retain LED modules or indicator lights 22 within cavity 18 of the mounting bar assembly 10. Since the individual mounting fingers 16 move independently from one another, a single LED module or indicator light may be removed from the mounting bar assembly 10 by displacing the individual mounting finger or fingers 16 which are responsible for retaining the individual LED module or indicator light within the mounting bar assembly 10. This may be done without disturbing the placement or retention of an adjacent LED module or indicator light 22 within the mounting bar assembly 10. When it is desired to mount an LED module or indicator light 22 within the mounting bar assembly 10, the module may be slid into the cavity 18 from an end 13 of the assembly 10. Alternatively, an LED module or indicator light 22 may be snapped into place by vertically displacing mounting fingers, such as individual finger 17 (FIG. 2B), which are deflectable.

The spacing apart of individual mounting fingers 16 by slots or gaps 20 provides a structure by which individual LED modules or indicator lights 22 may be positioned fairly accurately within mounting bar assembly 10. The tension exerted on the LED modules by the spring force of the individual fingers 16, plus the physical engagement of the LED module in cavity 18, both serve to hold the LED modules in place in assembly 10. However, there still exists a need at times for exact spacing between separate LED modules or indicator lights 22. To facilitate this exact spacing placement, as well as to further ensure against movement or loosening of individual LED modules or indicator lights 22 in the mounting bar assembly, alternative LED modules 26 and 28 (FIGS. 3–6) may be used. The individual LED modules or indicator lights 26 and 28 may be configured with locating protrusions such as protrusions 32 and 34. These protrusions 32 and 34 are preferably designed and configured to fit into slots or gaps 20 which are situated between individual mounting fingers 16. When the protrusions 32 or 34 fit into the slots 20 between mounting fingers 16, the LED modules or indicator lights 26 and 28 are retained in a specific lateral position within the cavity 18. The spacing between individual LED modules or indicator lights such as modules 26 and 28 may therefore be controlled by the number of individual mounting fingers 16 separating the locating protrusions 32 or 34 of the individual LED modules or indicator lights 26 and 28, respectively.

Figures 3, 4:
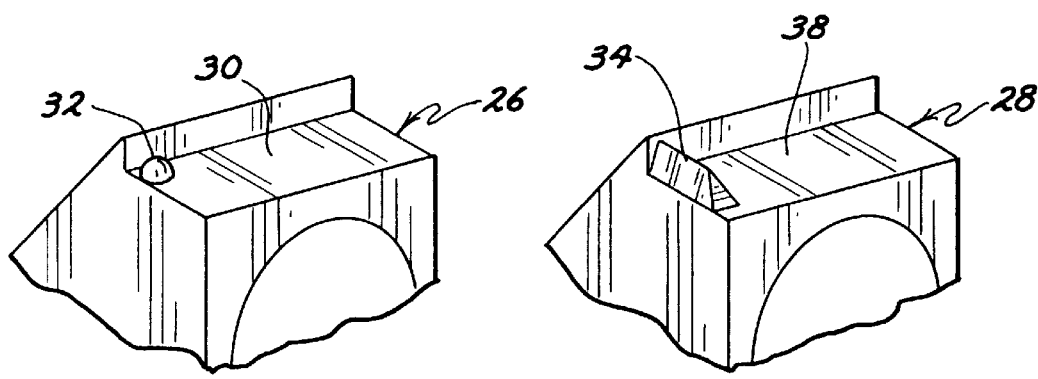
FIG. 3 is a partial perspective view of an alterative LED module.
FIG. 4 is a partial perspective view of a second alternative LED module.

Protrusion 32 on LED module 26 is shown as a hemispherical protrusion extending from top 30 of LED module 26 (FIG. 3). Other types of protrusions may be used for locating an individual LED module or indicator light. Such an alternative is shown as wedge shaped protrusion 34 which extends from top 38 of LED module or indicator light 28 (FIG. 4). The protrusions 32 and 34 serve as locating elements as well as adding to the ability of the mounting bar assembly 10 to retain LED modules 26 and 28 within the cavity 18.

The shape, size, and location of extending protrusions on LED modules may be altered without changing the scope of the invention. If the mounting fingers 16 are all uniform in width, and the slots or gaps 20 are also uniform in width, protrusions such as 32 and 34 may be used to quickly and accurately position and retain LED modules or indicator lights 26 and 28 at specific defined separations within the mounting assembly 10. The user need only count the number of mounting fingers 16 between LED modules or indicator lights in order to determine not only the separation between the modules, but also to determine the placement of additional LED modules or indicator lights at the same spacing distance. This placement configuration will work for protrusions situated in the slots or gaps 20 between individual mounting fingers 16 of mounting bar assembly 10, and is shown best in FIGS. 5–6.

Figure 7:
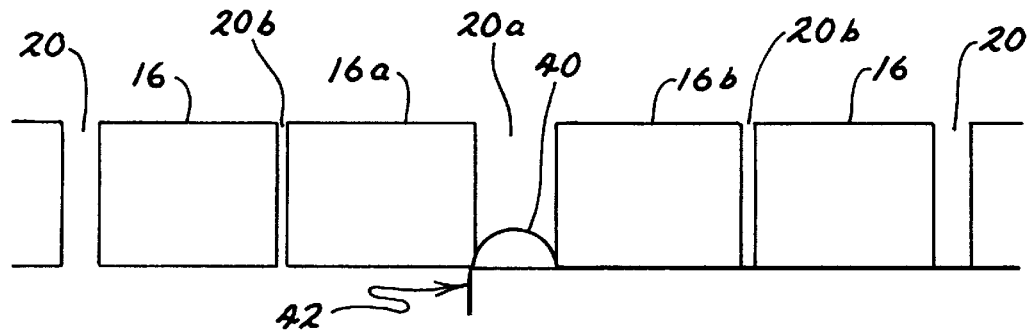
FIG. 7 is a front view of the mounting bar and an LED protrusion horizontally deflecting mounting fingers.
Figure 8:
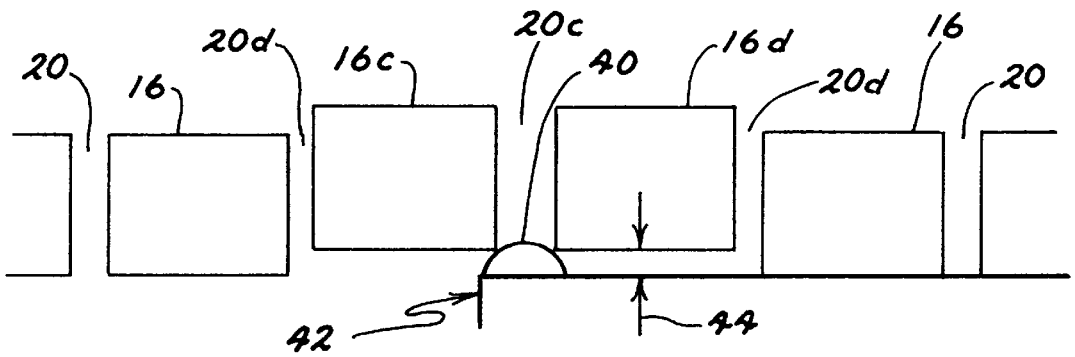
FIG. 8 is a front view of the mounting bar and an LED protrusion vertically deflecting mounting fingers.

The protrusions from the tops of LED modules may be sized in width to match the width of the gaps 20 between the individual mounting fingers 16. This is best shown in FIGS. 5–6. Alternatively, the protrusions may be sized to be wider than the slots or gaps 20. Referring to FIGS. 7–8, a hemispherical protrusion 40 which is wider than the gaps 20 may be seen. When the protrusion 40 is wider than the gaps 20 between mounting fingers 16, the specific fingers 16a and 16b may be deflected.

As seen in FIG. 7, protrusion 40 extending from the top of LED module 42 is wider than the standard slot or gap 20. Mounting fingers 16a and 16b are deflected horizontally away from protrusion 40, widening the gap 20a between mounting fingers 16a and 16b, and narrowing the gaps 20b on the far sides of mounting fingers 16a and 16b. The horizontal displacement of fingers 16a and 16b creates a tensioned holding or spring force which is exerted on protrusion 40 by the displaced fingers 16a and 16b. This spring force serves to hold the LED module 42 within the mounting bar assembly 10 with a spring tension horizontally as well as by the cavity and the normal vertical force of the mounting fingers 16.

Protrusion 40 may also be wider than gaps 20 of mounting bar assembly 10, and in that configuration may displace fingers 16c and 16d both horizontally and vertically (FIG. 8). This displacement results in a widening of slot or gap 20c and a narrowing of gaps 20d, as well as some vertical displacement 44 of mounting fingers 16c and 16d. Spring forces are therefore exerted both horizontally and vertically on protrusion 40, further assisting in the retention of LED module 42 within the mounting bar assembly 10.

Figure 9:
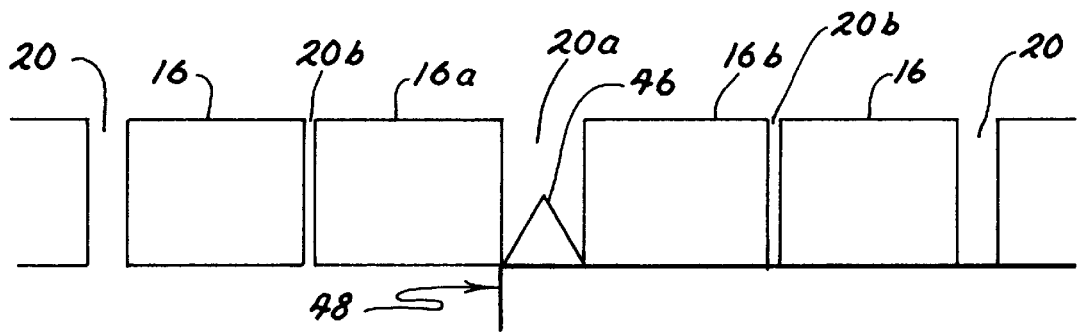
FIG. 9 is a front view of the mounting bar and an alternative LED protrusion horizontally deflecting mounting fingers.
Figure 10:
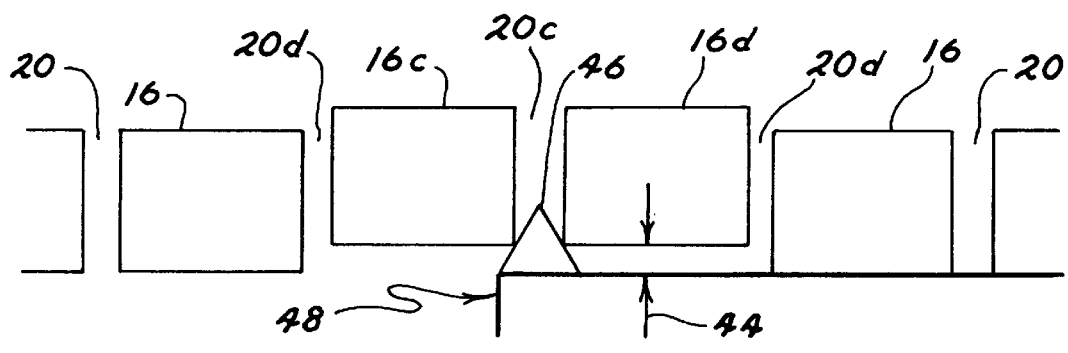
FIG. 10 is a front view of the mounting bar and the alternative LED protrusion vertically deflecting mounting fingers.

Alternative protrusions of different shape and size may be substituted without altering the scope of the invention. For example, FIGS. 9–10 show the effect of a wedge shaped protrusion 46 positioned on the top of LED module 48. In FIG. 9, mounting fingers 16a and 16b are shown to be horizontally displaced, widening slot gap 20a while narrowing slots or gaps 20b. Similarly, mounting protrusion 46 on LED module 48 in FIG. 10 is shown to displace mounting fingers 16c and 16d both horizontally to widen gap 20c and vertically by a displacement 44. The horizontal displacement of mounting fingers 16c and 16d also effects a narrowing of gaps 20d.

The detailed description outlined above is considered to be illustrative only of the principles of the invention. Numerous changes and modification will occur to those skilled in the art, and there is no intention to restrict the scope of the invention to the detailed description. The preferred embodiment having been described in detail the scope of the invention should be defined by the following claims.

What is claimed:

1. A mounting bar for spacing indicator lights used in electronic equipment, comprising:

an elongated channel bar of uniform cross-section, having a horizontal base flange and a top edge;

a plurality of spaced apart mounting fingers, each said mounting finger cantileverly, extending from said top edge so as to form a cavity having as its sides said bar, said base flange, and said mounting fingers;

a plurality of indicator light modules having indicator lights mounted therein, said modules including an upper and bottom housing, said modules also including a base support means, said plurality of indicator light modules being frictionally engaged within said cavity along the length thereof, with said upper and bottom module housings being restrainably engaged by said mounting fingers and base flange, respectively.

2. A mounting bar as described in claim 1, wherein each indicator light module has a protrusion extending therefrom, said protrusion fitting between a pair of spaced apart mounting fingers.

3. A mounting bar as described in claim 2, wherein each said protrusion is hemispherical in shape.

4. A mounting bar as described in claim 1, wherein each said protrusion is wedge shaped.

5. A mounting bar as described in claim 2, wherein the width of each said protrusion is equal to the width of the space between said individual mounting fingers.

6. A mounting bar as described in claim 2, wherein each said protrusion is wider than the spacing between individual mounting fingers.

7. In a mounting bar for spacing indicator lights used in electronic equipment, the mounting bar comprising an elongated channel bar of uniform cross-section, a top wall, and a base flange defining a cavity, a plurality of indicator light modules having an upper and bottom housing and a base support means, the indicator light modules frictionally engaged within said cavity, the improvement comprising:

said top wall divided into a plurality of spaced apart cantilevered mounting fingers, each said mounting finger frictionally engaging at least one individual light module within said cavity.

8. A mounting bar as described in claim 7, wherein each indicator light module has a protrusion extending therefrom, said protrusion fitting between a pair of spaced apart mounting fingers.

9. A mounting bar as described in claim 8, wherein each said protrusion is hemispherical in shape.

10. A mounting bar as described in claim 8, wherein each said protrusion is wedge shaped.

11. A mounting bar as described in claim 8, wherein the width of each said protrusion is equal to the width of the space between said individual mounting fingers.

12. A mounting bar as described in claim 8, wherein each said protrusion is wider than the spacing between individual mounting fingers.

* * * * *